(12) United States Patent
Ho et al.

(10) Patent No.: US 7,504,726 B2
(45) Date of Patent: Mar. 17, 2009

(54) CHIP AND MANUFACTURING METHOD AND APPLICATION THEREOF

(75) Inventors: Kwun-Yao Ho, Taipei Hsien (TW);
Moriss Kung, Taipei Hsien (TW);
Wen-Yuan Chang, Taipei Hsien (TW);
Hsueh Chung Shelton Lu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 190 days.

(21) Appl. No.: 11/530,193

(22) Filed: Sep. 8, 2006

(65) Prior Publication Data

US 2008/0122077 A1 May 29, 2008

(30) Foreign Application Priority Data

Jul. 18, 2006 (TW) .............................. 95126168 A

(51) Int. Cl.
*H01L 23/48* (2006.01)
*H01L 23/52* (2006.01)
*H01L 29/40* (2006.01)

(52) U.S. Cl. ...................... 257/758; 257/642
(58) Field of Classification Search ................ 257/750, 257/758, 642, 643
See application file for complete search history.

(56) References Cited

U.S. PATENT DOCUMENTS

| | | | | |
|---|---|---|---|---|
| 6,252,297 B1 * | 6/2001 | Kemmochi et al. | ......... | 257/640 |
| 6,479,900 B1 * | 11/2002 | Shinogi et al. | .............. | 257/758 |
| 6,825,567 B1 | 11/2004 | Wang et al. | | |
| 6,943,440 B2 * | 9/2005 | Kim et al. | .................... | 257/690 |
| 7,045,901 B2 | 5/2006 | Lin et al. | | |
| 7,091,616 B2 * | 8/2006 | Suminoe et al. | ............. | 257/773 |
| 2005/0098891 A1 * | 5/2005 | Wakabayashi et al. | ...... | 257/758 |
| 2005/0221601 A1 * | 10/2005 | Kawano | ..................... | 438/622 |

* cited by examiner

*Primary Examiner*—S. V Clark
(74) *Attorney, Agent, or Firm*—J.C. Patents

(57) ABSTRACT

The present invention provides a chip and its manufacturing methods and applications. Regarding the chip, there are several solder bumps on the backside of the chip. The difference of the invented chip from the convention chips is that the solder bumps are embedded in an insulting layer and a thermal-plastic material layer of the invented chip backside and separated by a conductive layer from the insulting layer and thermal-plastic material layer. Additionally, there are some end members in the insulating layer, and the end member corresponds to one solder bump. Through the present invention, chips with different functions can be integrated together, so that the needs for having portable communication devices lighter and smaller would be met.

14 Claims, 17 Drawing Sheets

US 7,504,726 B2

CHIP AND MANUFACTURING METHOD AND APPLICATION THEREOF

CROSS-REFERENCE TO RELATED APPLICATION

This application claims the priority benefit of Taiwan application serial no. 95126168, filed on Jul. 18, 2006. All disclosure of the Taiwan application is incorporated herein by reference.

BACKGROUND OF THE INVENTION

1. Field of the Invention

The present invention relates to a chip and its manufacturing method and applications. Particularly, the present invention relates to a chip that has a side of at least one embedded solder bump and the manufacturing method and applications of the chip.

2. Description of Related Art

During the development of the electronic industry, it is a continuous need to integrate chips of different functions into one chip or package to have an electronic apparatus lighter and smaller. For this purpose, there is a system-on-package (SOP) technology being developed.

For the SOP technology, U.S. Pat. No. 6,825,567, for example, has provided a face-to-face multi-chip flip-chip package, claiming that its invented structure could solve the capillary flow problems of underfilling materials. Additionally, among many kinds of SOP technology is a chip-on-chip technology. For instance, U.S. Pat. No. 7,045,901 has provides a chip-on-chip connection structure where some chip of this connection structure would be disposed on one rectangular open window hole of a printed circuit board.

The purpose of the present invention is to provide a novel chip-on-chip technology. The present invention provides a chip, and this chip can be used for connecting to other chips to create a chip-on-chip structure. Through the chips of the present invention, chips of different functions can be integrated into one package to fulfill the needs of having an electronic apparatus lighter and smaller.

SUMMARY OF THE INVENTION

The present invention provides a method of manufacturing a chip. The method at least comprises the steps as follows: a substrate is provided, and the substrate has at least one contact end; an insulation layer is formed on the substrate, and the insulation layer has at least one first opening; a thermal-plastic material layer is formed on the insulation layer, and the thermal-plastic material layer has at least one second opening; a conductive layer is formed in the first opening and the second opening; and a solder bump material is also formed in the first opening and the second opening.

The present invention also provides a chip manufactured by the present methods. The chip at least comprises a substrate, an insulation layer, a thermal-plastic material layer, a conductive layer, and a solder bump material. The chip also comprises at least one conductive member on the substrate, at least one first opening on the insulation layer, and at lease one second opening on the thermal-plastic material layer. Additionally, the conductive member has an end protruding from the substrate. The end of one conductive member is disposed in the first opening. Moreover, the conductive layer is disposed on the side walls of the first opening and the second opening, and a solder bump material also is formed in the first opening and the second opening.

The present invention further provides the applications of the invented chip. The applications include a chip structure. The chip structure is a jointed structure of one invented chip and the other invented chip. Or the chip structure is a jointed structure of one invented chip and one flip chip. Or the chip structure is a joint structure of one invented chip and one general die.

In order to the make aforementioned and other features and advantages of the present invention more comprehensible, a plurality of embodiments accompanied with figures is described in details below. Besides, the dimensions, materials, structures in the upcoming embodiments are only exemplary and not used for limiting the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
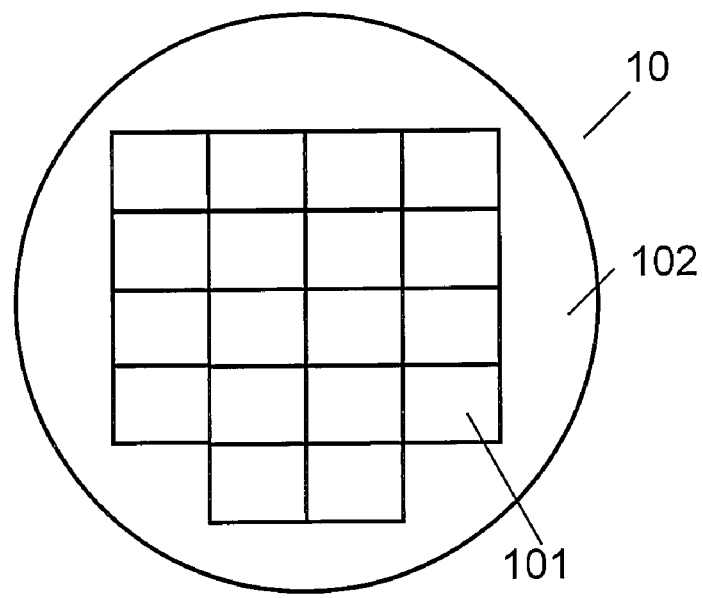
FIG. 1A shows a wafer provided by the embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
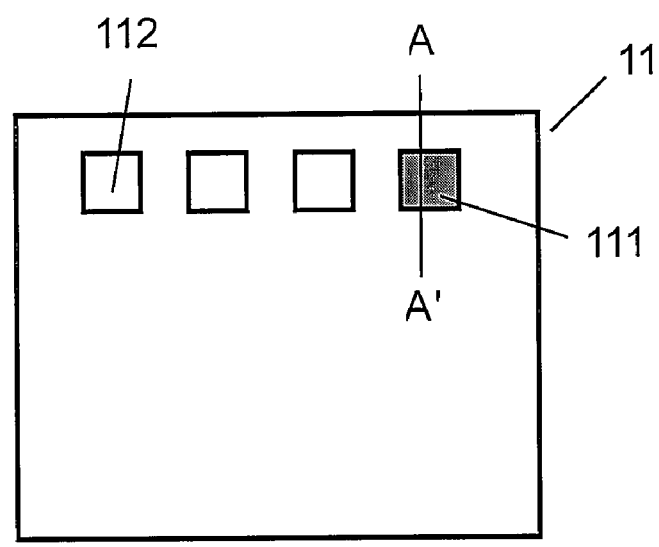
FIGS. 1B-1C show dies provided by the embodiments of the present invention.
Figure 1C:
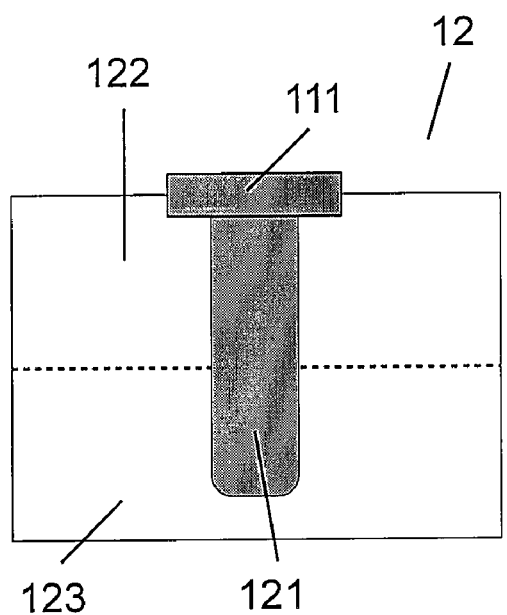

See FIGS. 1A-1C. To manufacture a chip of the embodiments of the present invention, a wafer 10 must be provided. As shown in FIG. 1A, the wafer 10 has a least one die 101. The die (11 or 101) is used for forming a chip. Inside the die 11 is one integrated circuit that has a least one pad (e.g., 111, 112) on the front surface 102 of the wafer, as shown in FIG. 1B.

Then, see FIG. 1C. In the pad-related die cross section from the line AA' of FIG. 1B, below a pad 111 is a conductive member 121. Besides, the die 12 in a cross section view may be separated into an integrated circuit (IC) region 122 and a ground region 123. The conductive member 121 passes from the IC region 122 to the ground region 123. The surface of the ground region 123 is the back surface of the wafer.

It should be noted that, in the embodiments of the present invention, a wafer may be a silicon substrate of a shape that may be circular, elliptic, rectangular, or square or of other shapes. Additionally, the selection of shape relies on the development of the electronic device manufacturing technology. Hence, the substrate shape in the present invention is not limited to what drawings illustrate.

Figure 2A:
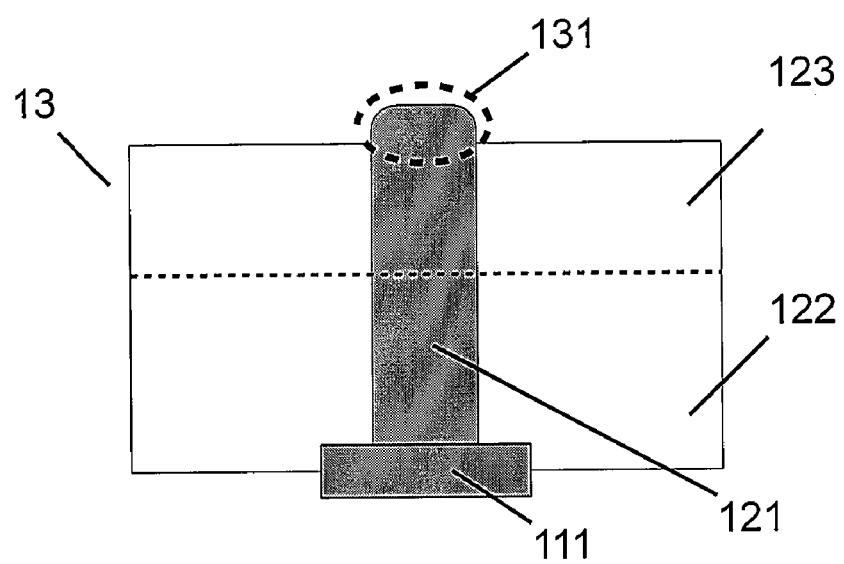
FIG. 2A shows a die provided by the embodiments of the present invention.
Figure 2B:
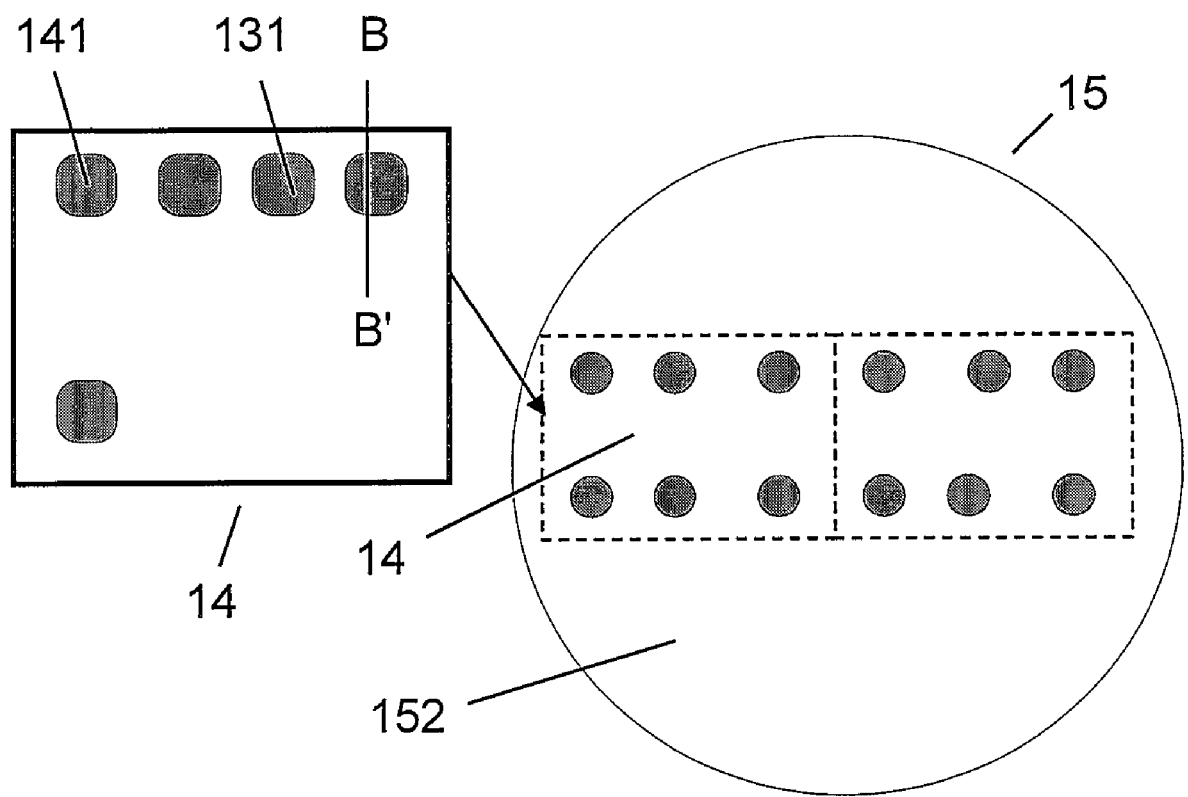
FIG. 2B shows a wafer provided by the embodiments of the present invention.

See FIGS. 2A and 2B. The die 13 in FIG. 2A is in a cross section view from the line BB' of FIG. 2B. To manufacture chips of the embodiments of the present invention, part of a ground region 123 must be removed to have a conductive member 121 exposed. As a result, a contact end 131 is made as shown in the die 13 in a cross section view in FIG. 2A. That is, the contact end 131 is one end of the conductive member 121. In the embodiments of the present invention, the method of removing part of a ground region 123 may be dry etching, wet etching, chemical mechanical polishing, or other material-removing technologies.

See FIG. 2B. After the removal of part of a ground region 123, there is at least one die backside region 14 on the back surface 152 of a wafer 15. The die backside region 14 has at least one contact end (e.g., 131, 141).

Figure 3A:
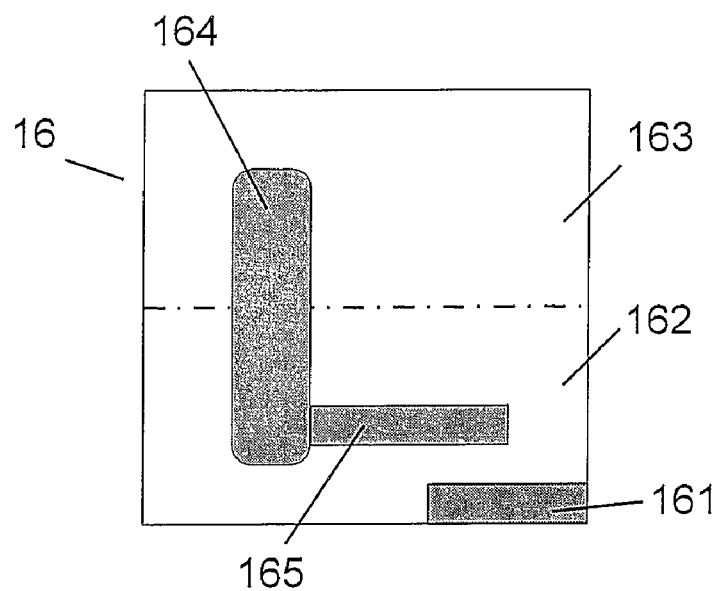
FIGS. 3A and 3B show dies provided by the embodiments of the present invention.
Figure 3B:
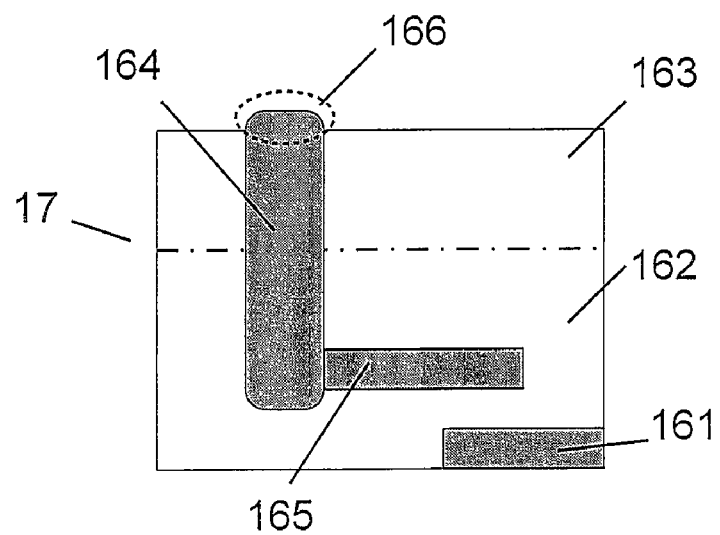

See FIGS. 3A-3B. To manufacture chips of the embodiments of the present invention, in the cross section 16 related to a pad 161, a conductive member 164 may not connect to the pad 161, as shown in FIG. 3A. However, the conductive member 164 may be connected to the pad 161 by other conductive line 165 or electronic device (e.g., any kinds of MOSFET, diode, and so on). For instance, the conductive line 165 may connect to the pad 161, that is not drawn, or the conductive line 165 may indirectly connect to the pad 161 through other circuits. Besides, the conductive line 165 may be disposed in an IC region 162, and the conductive member 164 may pass from the IC region 162 to a ground region 163. Moreover, use the methods related to FIG. 2A to remove part of the ground region 163 to have the conductive 164 exposed. As a result, a contact end 166 as shown in the cross section of the die 17 in FIG. 3B.

Figure 4A:
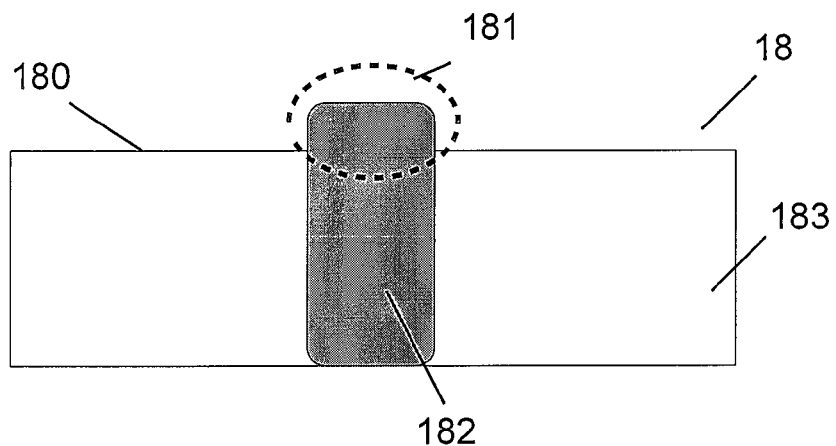
FIGS. 4A-4C, 5A-5C, 6A, 6B, 7A, 7B, and 8A-8C show the chip manufacturing methods in accordance with the embodiments of the present invention.
Figure 4B:
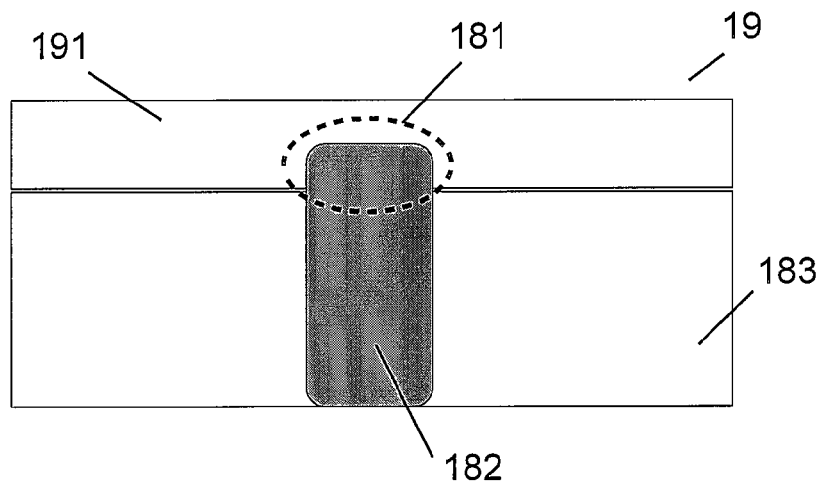
Figure 4C:
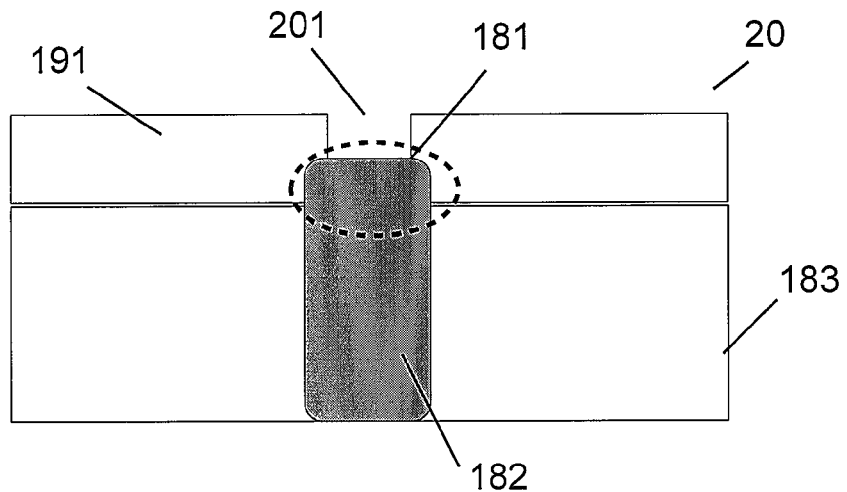

In FIGS. 4A-4C, they show some features related to the embodiments of the present invention, for example, dies (18, 19, and 20) in a cross section view, a conductive member 182, a contact end 181 (one end of the conductive member 182), and a ground region 183. See FIGS. 4A and 4B. To manufacture chips of the embodiments of the present invention, an insulation layer 191 is deposited on the surface 180 of the ground region 183. Then, part of the insulation layer 191 is removed to have an opening 201 corresponding to the contact end 181, as shown in FIG. 4C. It should be noted that in the embodiments of the present invention the scope of the opening 201 may be larger than that of the contact end 181, that is not drawn, or the scope of the opening 201 may be smaller than that of the contact end 181, or the scope of the opening 201 may be equal to that of the contact end 181, that is also not shown. In other words, after the removal of part of the insulation layer 191, the insulation layer 191 may still cover part of the contact end 181, or the insulation layer 191 may not cover part of the contact end 181, that is not drawn.

Figure 5A:
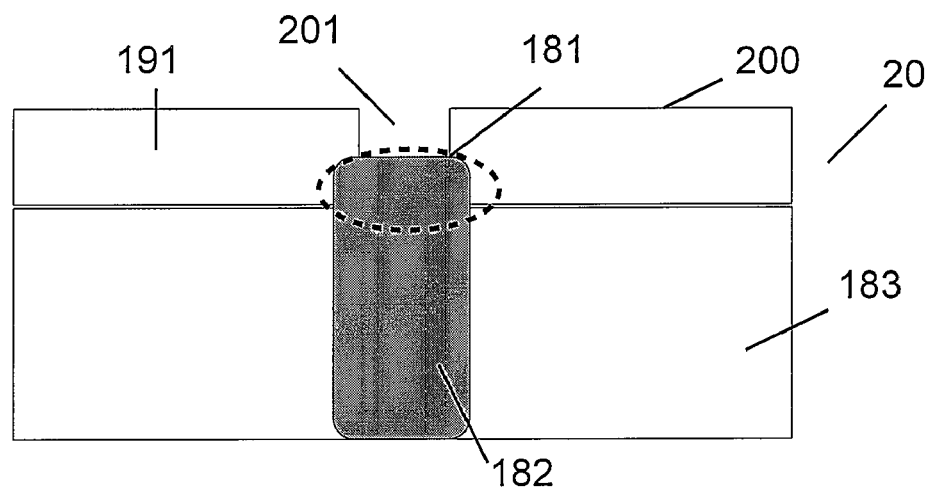
Figure 5B:
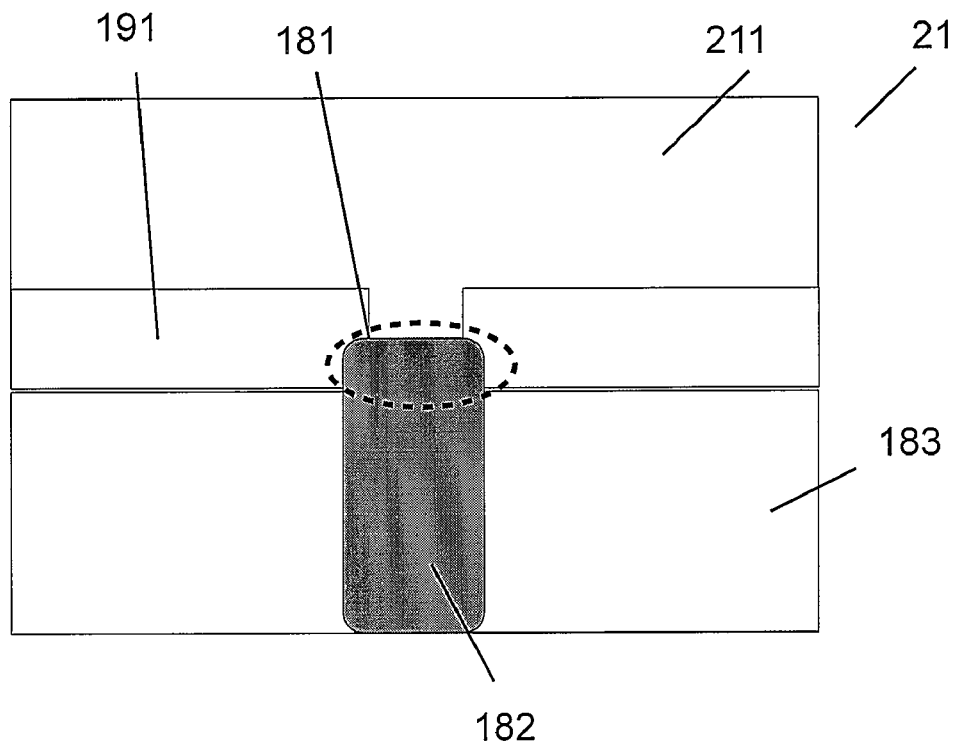
Figure 5C:
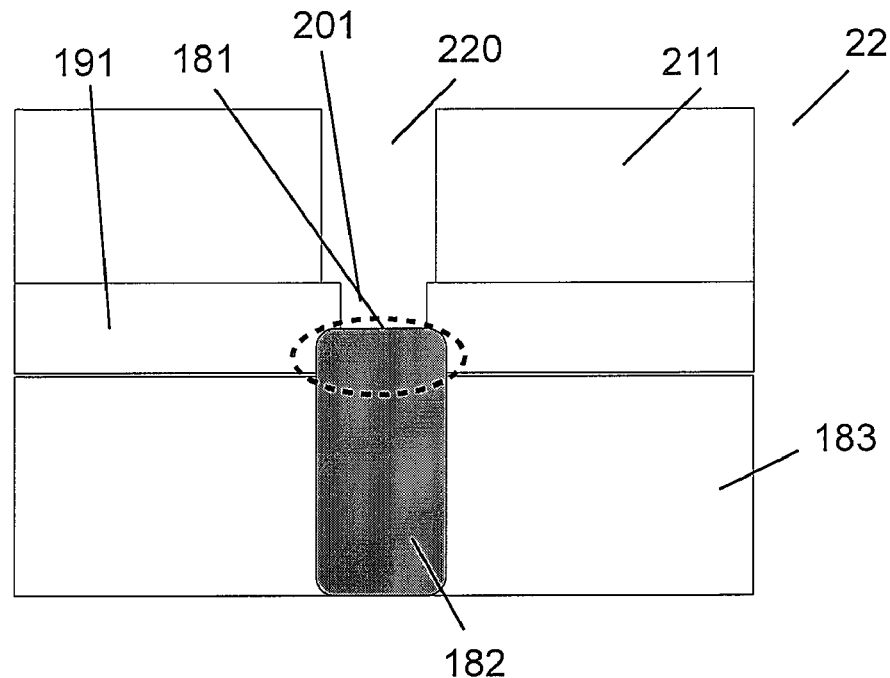

See FIGS. 5A-5C. The dies (20, 21, and 22) of the embodiments of the present invention are shown in a cross section view. With reference to FIGS. 5A and 5B, to manufacture chips of the embodiments of the present invention, the surface 200 of the insulation layer 191 is covered by a thermal-plastic material layer 211. At the time, the opening 201 may be filled, or the opening 201 may not be filled, that is not drawn. Later, in FIG. 5C, part of the thermal-plastic material layer 211 is removed to have an opening 220 corresponding to the contact end 181. It should be noted that in the embodiments of the present invention, with reference to FIG. 5C, the scope of the opening 220 may be larger than that of the opening 201; or the scope of the opening 220 may be equal to that of the opening 201, that is not drawn; or the scope of the opening 220 may be smaller than that of the opening 201, that is not drawn. Additionally, in the embodiments of the present invention, with reference to FIG. 5C, the thermal-plastic material layer 211 may not cover the insulation layer 191 of the side wall in the opening 201; or the thermal-plastic material layer 211 may cover the insulation layer 191 of the side wall in the opening 201, that is not drawn. Furthermore, the thermal-plastic material layer 211 may not cover the contact end 181; or the thermal-plastic material layer 211 may cover the contact end 181, that is not drawn.

It should be noted that the thermal-plastic materials used in the embodiments of the present invention are a kind of material that has a characteristic where the higher the material's temperature, the higher the material's elasticity or fluidity. This material may be polymers, complex compounds, or other thermal-plastic materials.

Figure 6A:
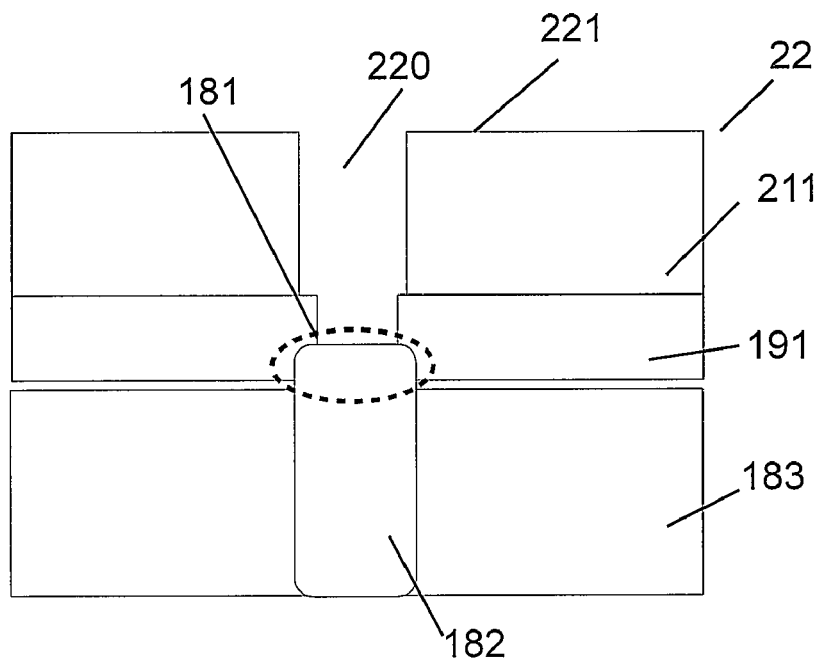
Figure 6B:
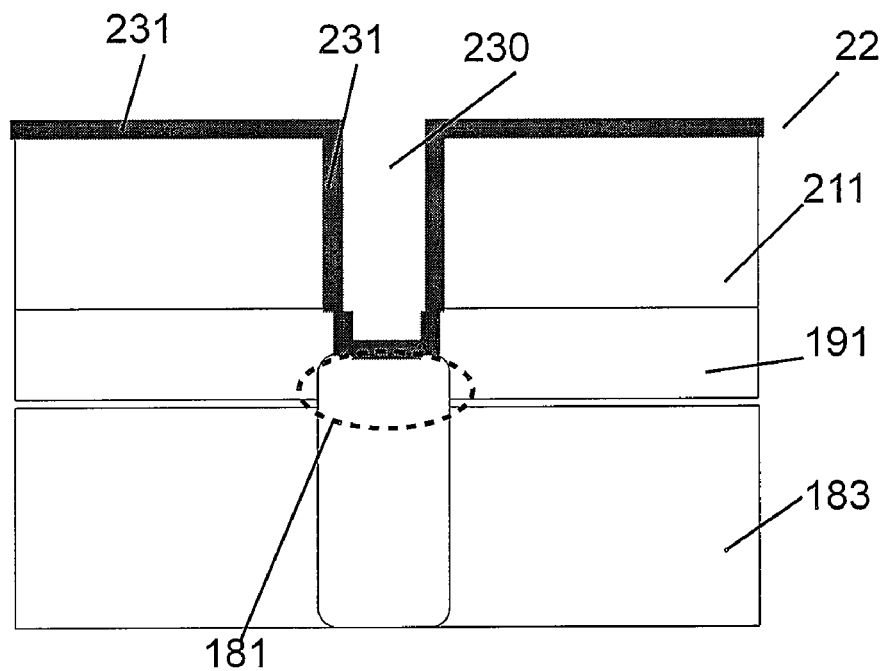

See FIGS. 6A and 6B. The dies (22 and 23) of the embodiments of the present invention are shown in a cross section view. To manufacture chips of the embodiments of the present invention, a conductive layer 231 is deposited on the surface 221 of the thermal-plastic material layer 211, as shown in FIG. 6B. The conductive layer 231 may be an UBM (Under Ball Metallurgy or Under Bump Metallurgy) layer, other kinds of metal layer, or an alloy layer. At the time, the conductive layer 231 may be formed on the side wall in the opening 230. In the embodiments of the present invention, the method of forming a conductive layer 231 is physical deposition, chemical deposition, electroplating, or other technologies that can form a conductive layer.

To manufacture chips of the embodiments of the present invention, a solder bump has to be formed in the opening 230. After that, the conductive layer 231 disposed on the thermal-plastic material layer 211 is removed. The details of the procedure are illustrated in FIGS. 7A, 7B, and 8A-8C.

Figure 7A:
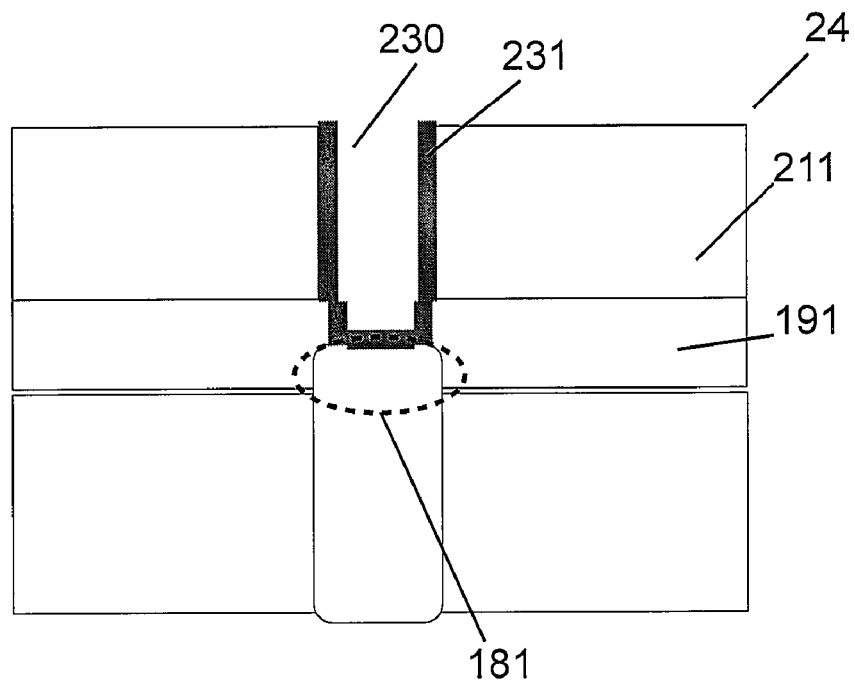
Figure 7B:
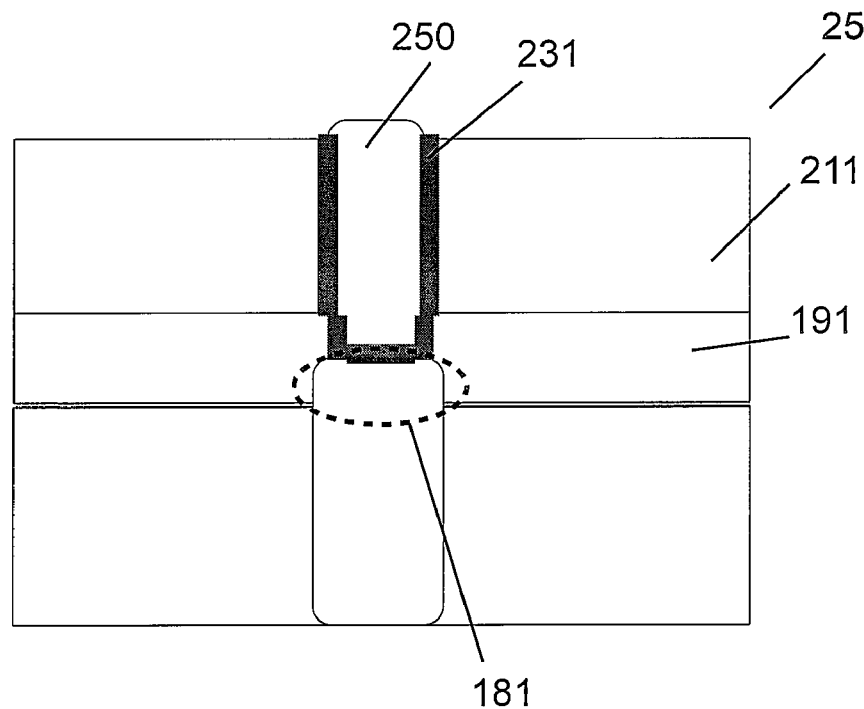

See FIGS. 7A and 7B. The dies 24, 25 related to the embodiments of the present invention are shown in a cross section. To manufacture chips of the embodiments of the present invention, with reference to FIG. 7A, the conductive layer 231 on the thermal-plastic material layer 211 is removed, but the conductive layer 231 on the side wall in the opening 230 is not removed. In the embodiments of the present invention, the method of removing the conductive layer 231 is dry etching, wet etching, chemical mechanical polishing, or other technologies for removing materials. Then, with reference to FIG. 7B, after the removal of the conductive layer 231 on the thermal-plastic material layer 211, a solder bump 250 is formed in the opening 230.

Figure 8A:
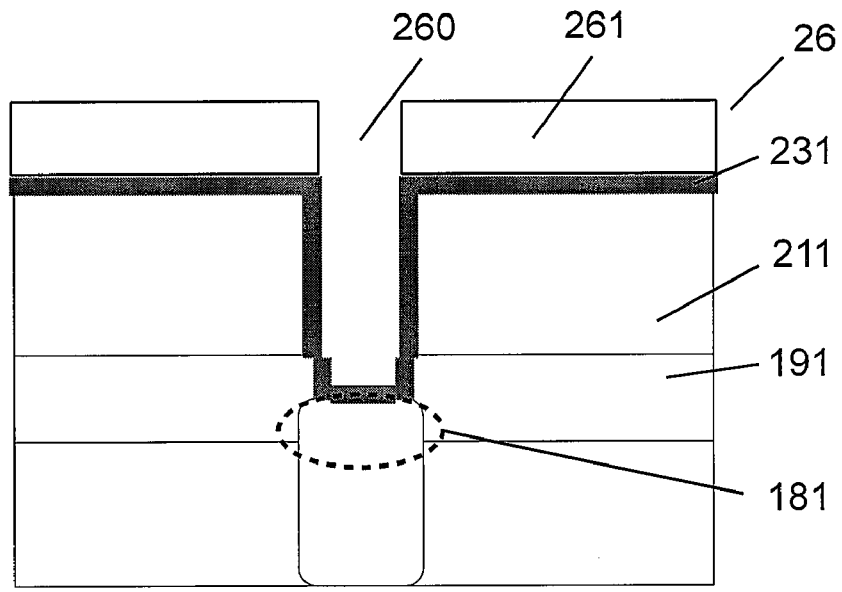
Figure 8B:
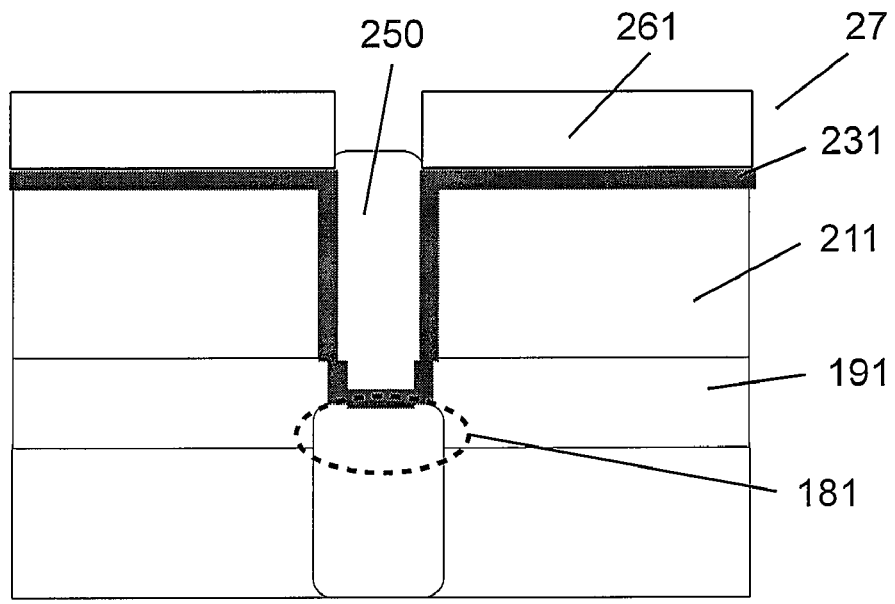
Figure 8C:
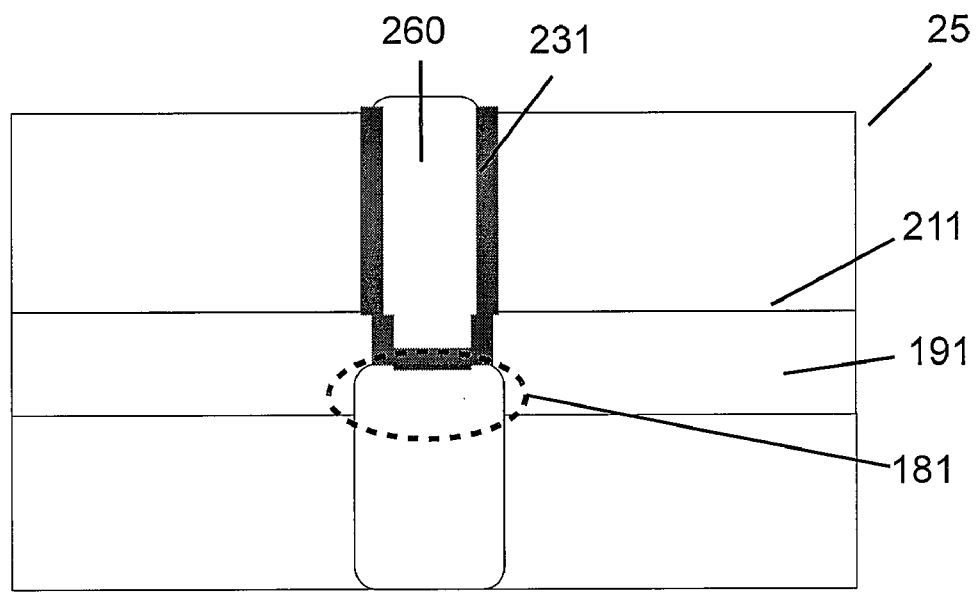

See FIGS. 8A-8C. To manufacture chips of the embodiments of the present invention, there are alternative ways of making the die 25 as shown in FIG. 7B. First, with reference to FIG. 8A, a mask layer 261 is formed on the conductive layer 231. Secondly, with reference to FIG. 8B, an opening 260 is formed to have a solder bump able to fill out the opening 260. Then, a solder bump 250 is formed in the opening 260. After that, with reference to FIG. 8C, the mask layer 261 is removed. Finally, the conductive layer 231 on the thermal-plastic material layer 211 is removed.

In the embodiments of the present invention, a method of forming a mask layer 261, that is not drawn, comprises: first forming a mask layer 261 on the conductive layer 231 and in the opening 230 of FIG. 6B, then using a lithography process to form a photo-resist pattern corresponding to the opening 230 on the mask layer 261, where there is no photo resist material at a place corresponding to the opening 230 in the photo-resist pattern, and later using an etching process to remove the mask layer 261 in the opening 230 such that an opening 260 in FIG. 8A is formed.

In the embodiments of the present invention, the methods of forming the above-mentioned openings are lithography, etching, laser drilling, mechanical drilling, or other technologies of forming an opening. Additionally, the methods of filling a solder bump in an opening are screen printing, stencil printing, dipping, or other technologies of forming a solder bump.

It should be noted that, in the embodiments of the present invention, after the opening is filled with a solder bump 250, a reflow process may be carried out to have the opening filled more completely with the solder bump 250. Besides, when the steps related to FIG. 7B are carried out, if some solder bump materials are also formed on the thermal-plastic material layer 211, these solder bump materials may be removed after or before the reflow process. (That is not drawn.) When the steps related to FIG. 8B are carried out, if some solder bump materials are also formed on the mask layer 261, these solder bump materials may be removed before the removal of the mask layer 261.

By the manufacturing methods mentioned above, chips of the embodiments of the present invention can be made. The main structure of the invented chips is shown in the die 28 in a cross section view in FIG. 9A. That is, a chip of the present invention comprises a substrate 282, an insulation layer 191, a thermal-plastic material layer 211, and at least one solder bump member 280. And, between each solder bump member 280 and the insulation layer 191 (or thermal-plastic material layer 211) is a conductive layer 231. Additionally, FIG. 9B is the top view of the chip.

Figure 9A:
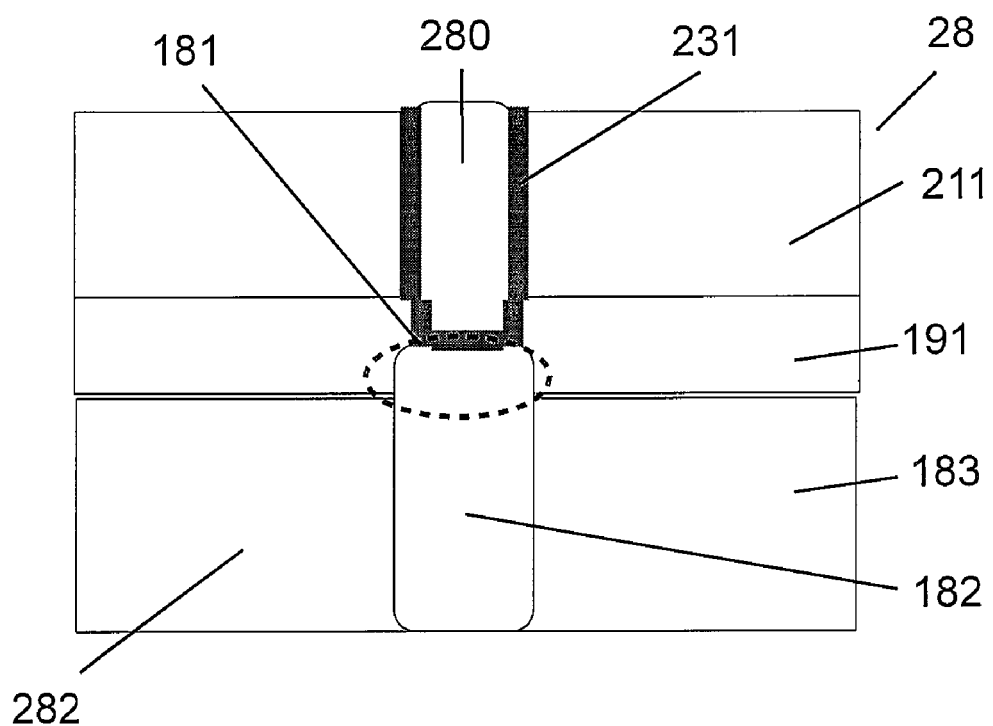
FIGS. 9A and 9B show chips in accordance with the embodiments of the present invention.
Figure 9B:
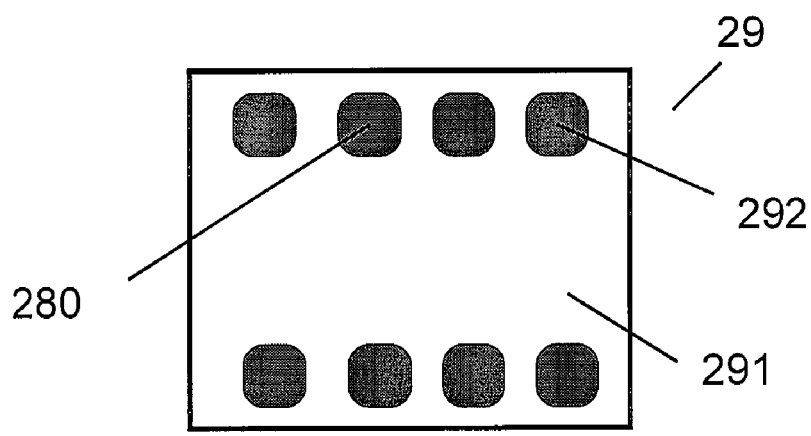

See FIG. 9A. In a chip structure of the embodiments of the present invention, a substrate 282 may comprise an IC region (not shown), a ground region 183, and a conductive member 182. The conductive member 182 may have a contact end 181 that protrudes into the insulation layer 191 and that is used to electrically contact other substrates (e.g., chip). It should be noted that the contact end 181 may be disposed in the insulation layer 191, be disposed in the insulation layer 191 while passing through it 191, that is not drawn, or extend to the thermal-plastic material layer 211, that is not drawn. Besides, there may be a conductive layer 231 between the contact end 181 and the solder bump member 280.

In the embodiments of the present invention, the above-mentioned ground region may be composed of silicon or other semiconductor materials. The above-mentioned conductive members may be composed of aluminum, gold, copper, nickel, tungsten, other metals, or alloys. The above-mentioned conductive layer may be UBM, metal layer, multi-layer metal layer, alloy layer, or multi-layer alloy layer.

Figure 11:
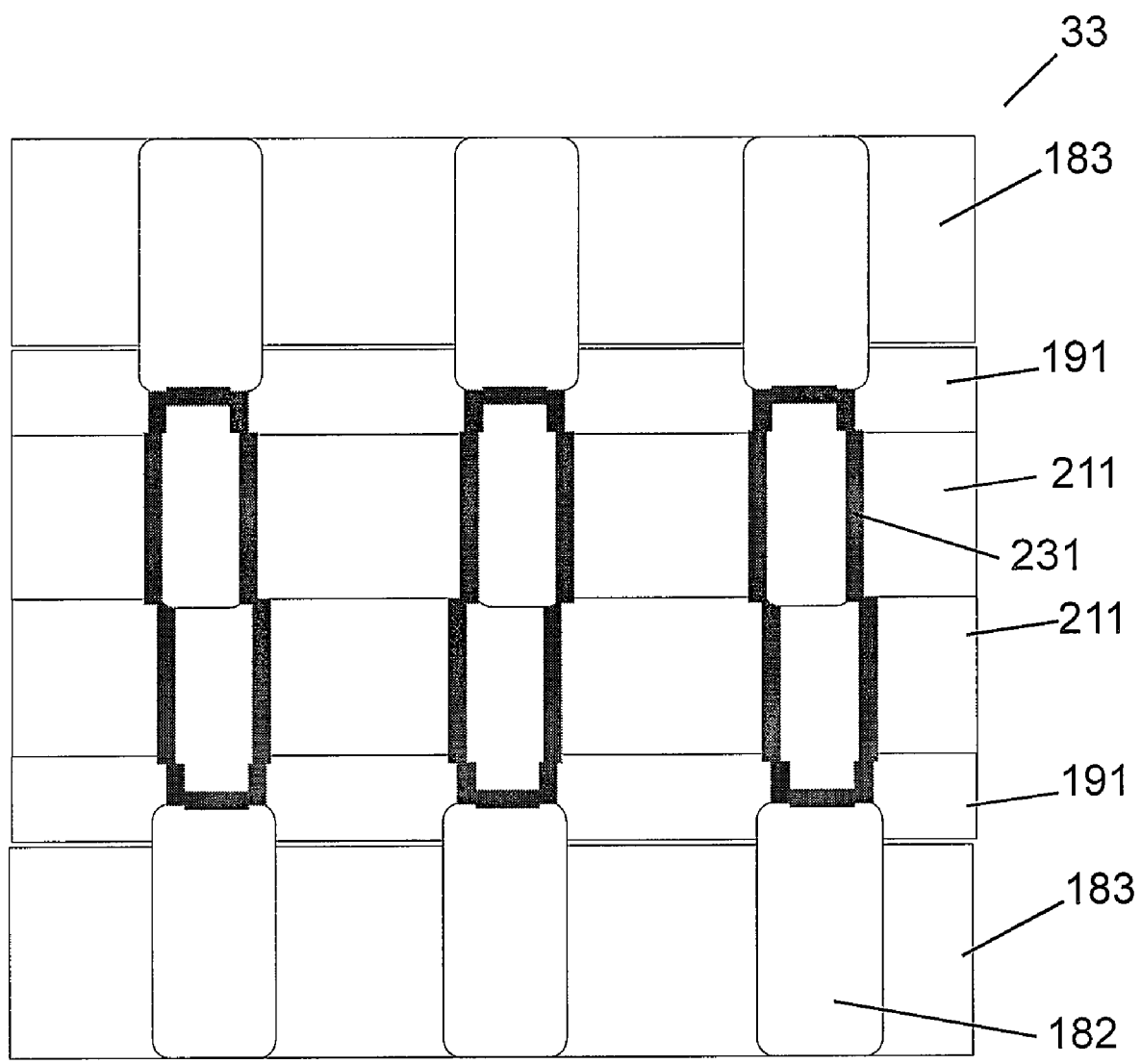
Figure 13:
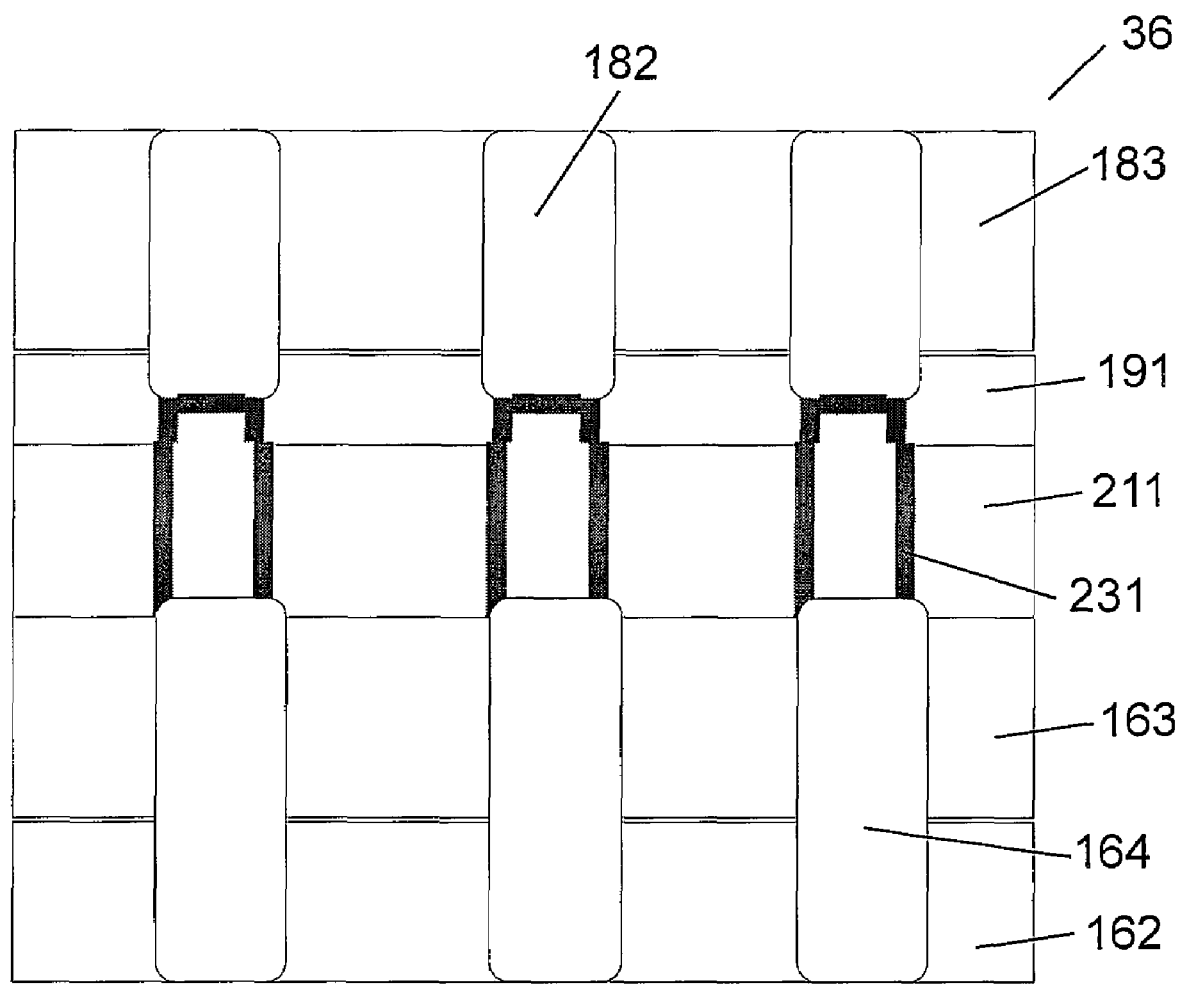
Figure 15:
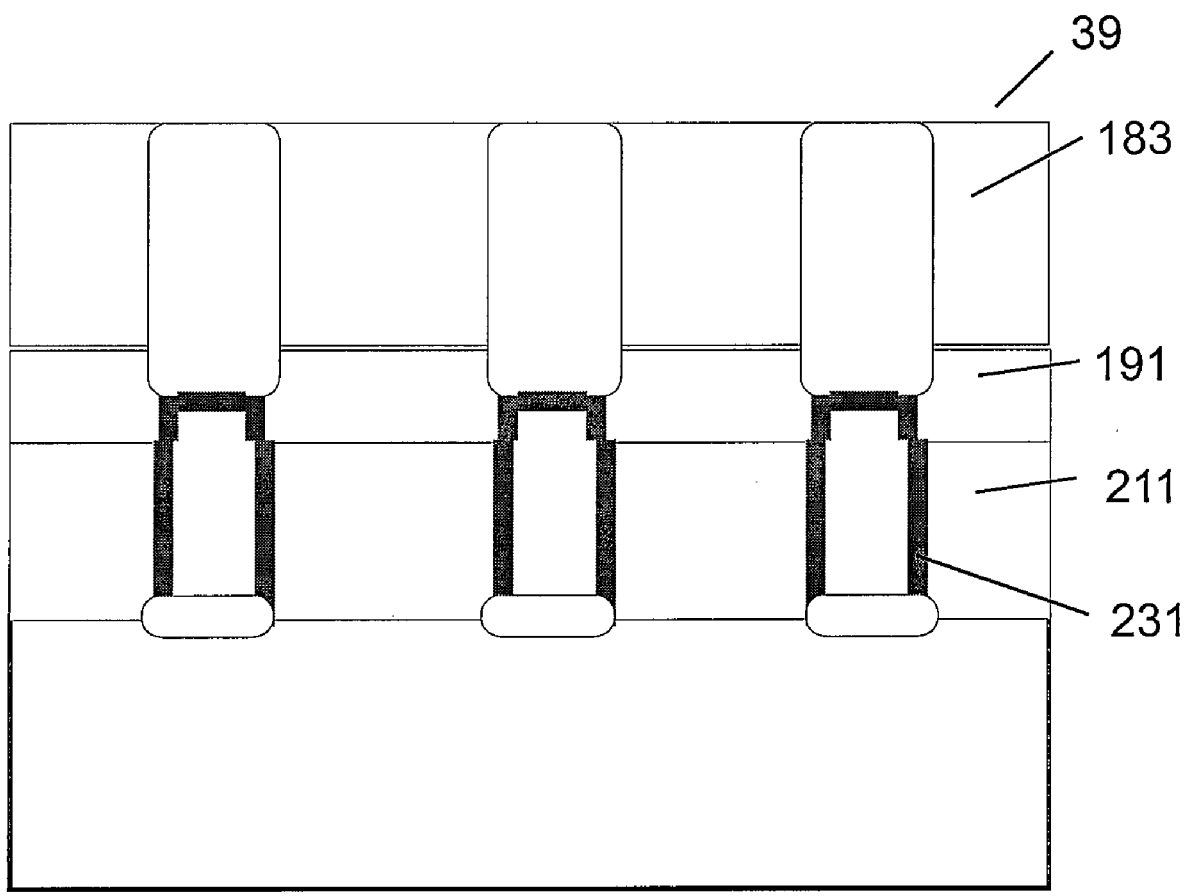

See FIGS. 11, 13, and 15. Based on the chips of the embodiments of the present invention, the prevent invention further comes out with some applications of the invented chips. The details of structures and their manufacturing methods are described below.

Figure 10:
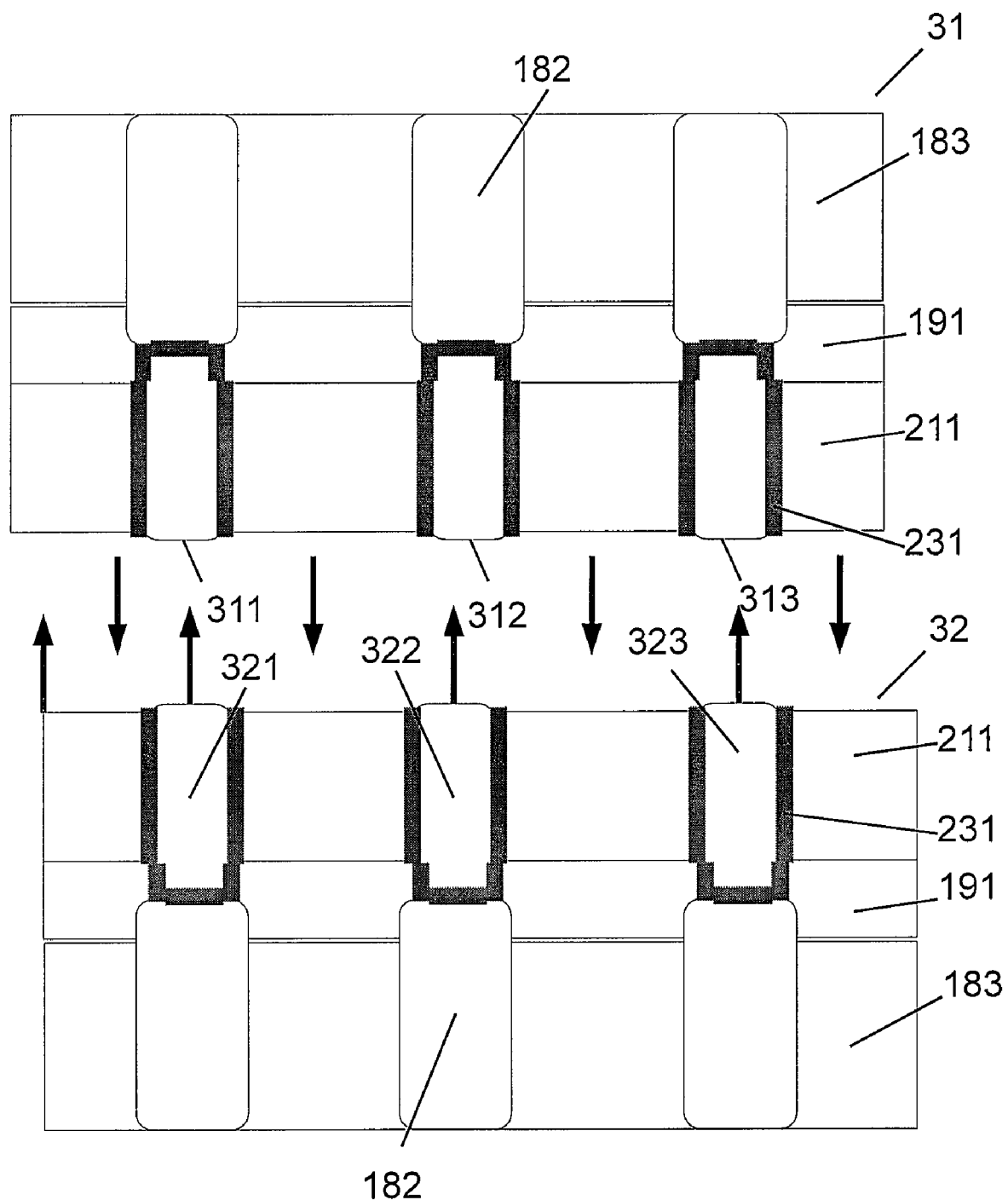
FIGS. 10-15 show applications of chips in accordance with the embodiments of the present invention.

See FIG. 10. Chips 31, 32 of the embodiments of the present invention are shown. There is at least one contact member (e.g., 311, 312, 313) on the chip 31, and there is at least one contact member (e.g., 321, 322, 323) on the chip 32. In FIG. 10, the arrows stand for a compression method where these two chips are compressed toward each other. Additionally, the contact member 311 corresponds to the contact member 321, the contact member 312 corresponds to the contact member 322, and the contact member 313 corresponds to the contact member 323.

See FIG. 11. After the compression process related to FIG. 10, a chip structure of the embodiments of the present invention is created. The chip structure comprises at one above-mentioned chip (e.g., 31, 32) of the present invention, as shown in FIG. 10. The chips have many contact members 311, 312, 313, 321, 322, 323. On the chip 31, there is at least one contact member (e.g., contact member 311) corresponding to one contact member 321 of the chip 32. Besides, the contact member 311 and the contact member 321 are jointed.

In the embodiments related to FIGS. 10 and 11, a contact member (e.g., 311, 312, 313, 321, 322, 323) is made of a solder bump.

Figure 12:
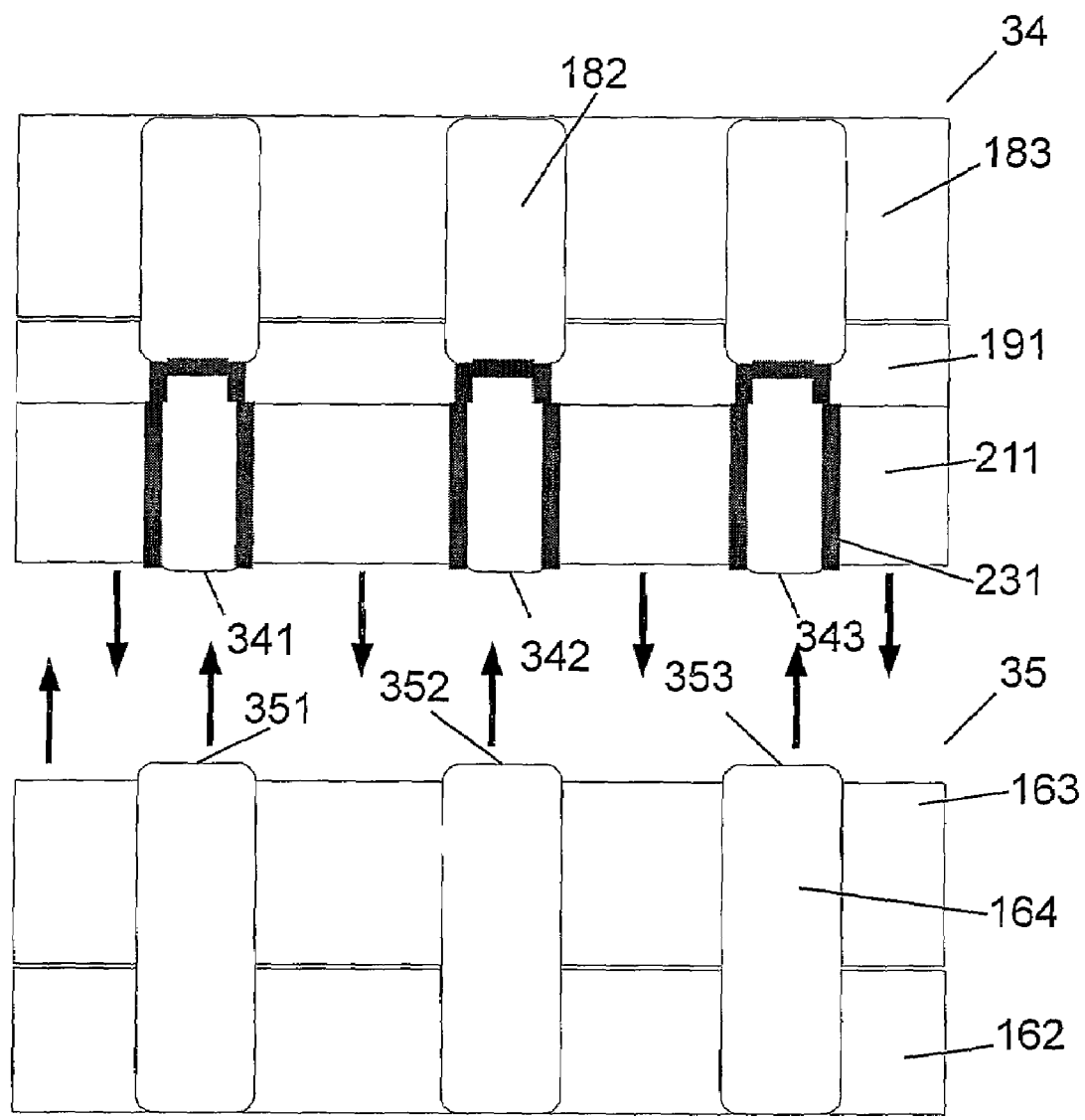

See FIG. 12. A chip 34 of the embodiments of the present invention and a substrate 35 are shown. They are like what is related to the cross section 13 of FIG. 2 or the substrate of the cross section 17 of FIG. 3. There is at least one contact member (e.g., 341, 342, 343) on the chip 34, and there is at least one contact end (e.g., 351, 352, 353) on the substrate 35. In FIG. 12, the arrows stand for a compression method where the chip 34 and the substrate 35 are compressed toward each other. Besides, the contact member 341 corresponds to the contact end 351, the contact member 342 corresponds to the contact end 352, and the contact member 343 corresponds to the contact end 353.

See FIG. 13. After the compression process related to FIG. 12, a chip application of the embodiments of the present invention is completed. The chip structure 36 comprises at least one above-mentioned chip 34 of the present invention (shown in FIG. 12) and at least one above-mentioned substrate 35 (shown in FIGS. 2 and 3). There are several contact members (341, 342, 343) on the chip 34, and there are many contact ends (351, 352, 353) on the substrate 35. Additionally, on the chip 34, there is at least one contact member, for instance, contact member 341, corresponding to one contact end 351 of the substrate 35. The contact member 341 and the contact end 351 are jointed.

In the embodiments related to FIGS. 12 and 13, the function of a contact end (e.g., 351, 352, 353) may be considered a contact member.

Figure 14:
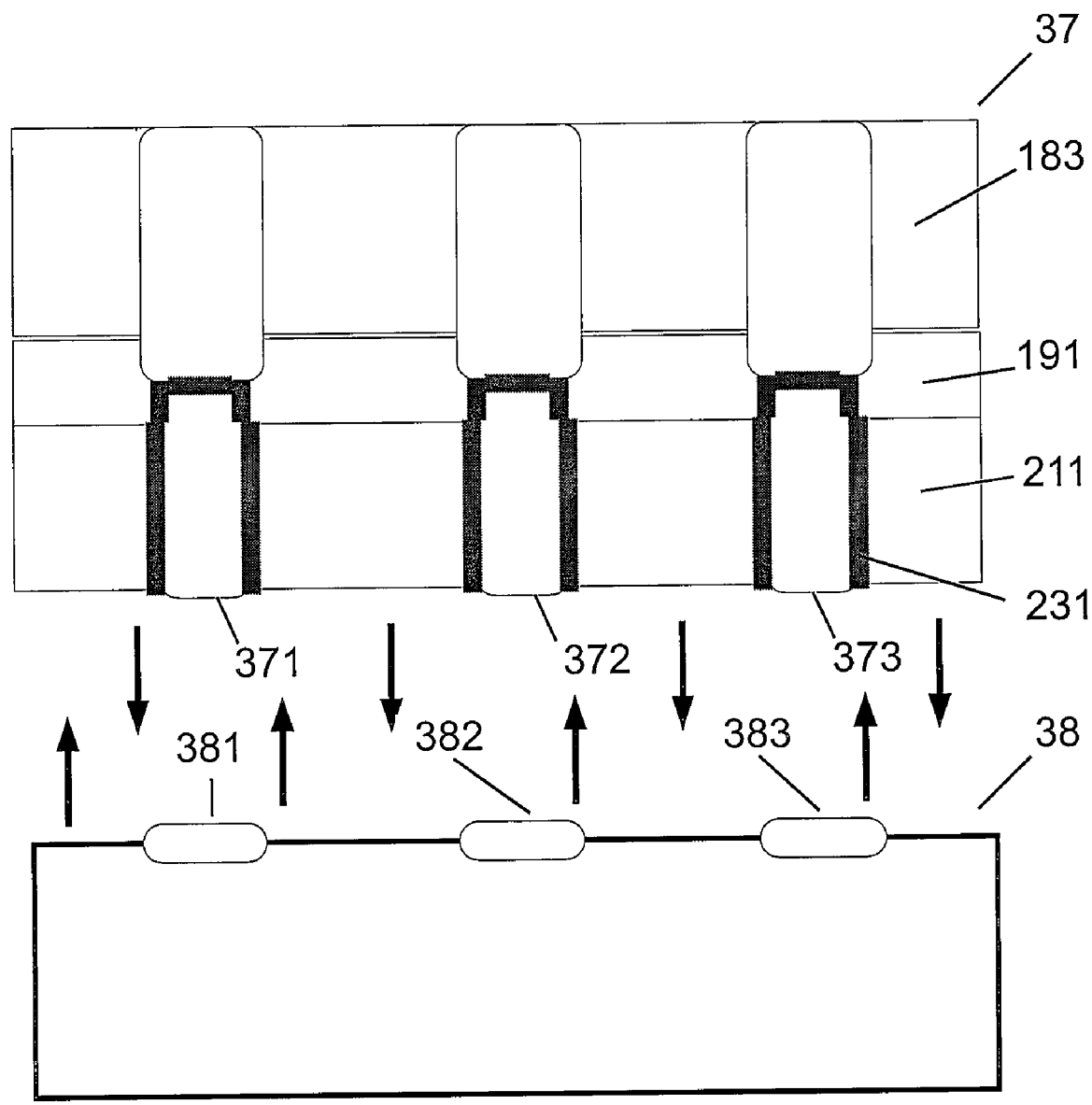

See FIG. 14. A chip 37 of the embodiments of the present invention and a chip 38 that has pads are shown. There is at least one contact member (e.g., 371, 372, 373) on the chip 37, and there is also at least one contact member (e.g., 381, 382, 383) on the chip 38. In FIG. 14, the arrows stand for a compression process where the chip 37 and the chip 38 are compressed toward each other. The contact member 371 corresponds to the contact member 381; the contact member 372 corresponds to the contact member 382; the contact member 373 corresponds to the contact member 383. In the embodiments of the present invention, the contact members 381, 382, 383 may be a pad.

See FIG. 15. After the compression process related to FIG. 14, a chip application of the embodiments of the present invention is made. The chip structure 39 comprises at lease one above-mentioned chip 37 of the present invention (shown in FIG. 14) and a least one above-mentioned chip 38 that has pads. There are many contact members (e.g., 371, 372, 373) on the chip 37, and there are many pads (e.g., 381, 382, 383) on the chip 38. Besides, on the chip 37, there is at least one contact member, for example, contact member 371, corresponding to one pad 381 of the chip 38. The contact member 371 and the pad 381 are jointed.

In the embodiments related to FIGS. 10-15, a contact member (e.g., 311, 312, 313, 321, 322, 323, 341, 342, 343, 371, 372, 373) may be composed of solder bump materials.

In the embodiments of the present invention, the above-mentioned compression method may comprise the steps as follows: have a plurality of chips of the present invention compressed; heat the thermal-plastic material layer to have it become viscous; keep heating the chips until the surfaces of the corresponding contact members of different chips start to get jointed; finally cool down the chips.

In the embodiments related to FIGS. 10-15, besides the present invention may be implanted in wafers, the present invention is also implanted in a single chip that comes from dies diced from a wafer.

It should be noted that because a thermal-plastic material is used in the embodiments of the present invention, when the above-mentioned chips are in the compression process, the viscosity of the thermal-plastic material can help the compressed chips get jointed with each other compactly. In other words, because a thermal-plastic material is easily deformed during heating, the structural stresses caused by the compression process are released. The shape of the thermal-plastic material can be adjusted to compensate the local-region deformation caused by jointing solder bump materials.

Though the present invention has been disclosed above by a plurality of embodiments, they are not intended to limit the invention. Anybody skilled in the art can make some modifications and variations without departing from the spirit and scope of the invention. Therefore, the protecting range of the present invention falls in the appended claims.

What is claimed is:

1. A chip, at least comprising:
   a substrate having at least one conductive member, wherein the conductive member penetrates through a ground region of the substrate, and the conductive member has an end protruding from a surface of the ground region of the substrate;
   an insulation layer disposed on the surface of the ground region of the substrate and having at least one first opening, wherein the end of one conductive member is disposed in the first opening;
   a thermal-plastic material layer disposed on the insulation layer and having at lease one second opening, wherein one first opening is below the second opening;
   a conductive layer disposed on the side walls of the first opening and the second opening; and
   a solder bump material formed in the first opening and the second opening.

2. The chip of claim 1, wherein the substrate comprises an integrated circuit region and a ground region.

3. The chip of claim 1, wherein the substrate is made of semiconductor material.

4. The chip of claim 1, wherein the conductive member is made of metal material.

5. The chip of claim 1, wherein the insulation layer covers part of the end.

6. The chip of claim 1, wherein the size of the first opening is larger than that of the end.

7. The chip of claim 1, wherein each end is arranged to be corresponding to the first opening respectively.

8. The chip of claim 1, wherein the conductive layer is composed of at least one single metal layer.

9. The chip of claim 1, wherein the solder bump material is formed on the conductive layer.

10. The chip of claim 1, wherein the conductive layer is disposed between the solder bump material and the end.

11. A chip-on-chip structure, at least comprising:
    a first chip, at least comprising:
    a first substrate having at least one first conductive member, wherein the first conductive member penetrates through a around region of the first substrate, and the first conductive member has a first end protruding from a surface of the ground region of the first substrate;
    a first insulation layer disposed on the surface of the ground region of the first substrate;
    a first thermal-plastic material layer disposed on the first insulation layer;
    at least one first contact member, wherein the first contact member is electrically coupled to the first end; and
    a first conductive layer disposed between the first end and the first contact member, between the first end and the first insulation layer, and between the first end and the first thermal-plastic material layer; and
    a second chip having at least one second contact member, wherein the second contact member is connected to one first contact member.

12. The chip-on-chip structure of claim 11, wherein the second chip at least comprises:
    a second substrate having at least one second conductive member, wherein the second conductive member has a second end protruding from the second substrate;
    a second insulation layer disposed on the second substrate;
    a second thermal-plastic material layer disposed on the second insulation layer;
    at least one second contact member, wherein the second contact member corresponds to one second end; and
    a second conductive layer disposed between the second end and the second contact member, between the second end and the second insulation layer, and between the second end and the second thermal-plastic material layer.

13. The chip-on-chip structure of claim 11, wherein the second chip at least comprises: a second substrate having at least one second conductive member, wherein the second conductive member has one second end protruding from the second substrate.

14. The chip-on-chip structure of claim 11, wherein the second contact member is a pad.

* * * * *